United States Patent
Kim et al.

(10) Patent No.: US 11,170,832 B2
(45) Date of Patent: Nov. 9, 2021

(54) MAGNETIC MEMORY DEVICES

(71) Applicant: SAMSUNG ELECTRONICS CO., LTD., Suwon-si (KR)

(72) Inventors: Ki Woong Kim, Hwaseong-si (KR); Juhyun Kim, Yongin-si (KR); Se Chung Oh, Yongin-si (KR); Ung Hwan Pi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/552,110

(22) Filed: Aug. 27, 2019

(65) Prior Publication Data
US 2020/0152251 A1    May 14, 2020

(30) Foreign Application Priority Data
Nov. 14, 2018 (KR) .......................... 10-2018-0139731

(51) Int. Cl.
| | |
|---|---|
| *H01L 27/22* | (2006.01) |
| *G11C 11/16* | (2006.01) |
| *H01L 43/12* | (2006.01) |
| *H01L 43/10* | (2006.01) |
| *H01L 43/02* | (2006.01) |

(52) U.S. Cl.
CPC .......... *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC ........... G11C 11/161; G11C 2211/5615; H01L 27/222; H01L 43/12; H01L 43/10; H01L 43/02; H01L 43/08; H01L 27/22–228; H01L 43/00–14; G01R 33/098; G01R 15/20–207; G11B 5/3909
See application file for complete search history.

(56) References Cited

U.S. PATENT DOCUMENTS

| | | | |
|---|---|---|---|
| 6,005,800 A | 12/1999 | Koch et al. | |
| 6,570,783 B1 | 5/2003 | Deak | |
| 9,343,658 B2 | 5/2016 | Wang et al. | |
| 9,853,205 B1 | 12/2017 | Allenspach et al. | |
| 9,882,118 B2 | 1/2018 | Hirohata | |
| 2012/0038011 A1* | 2/2012 | Iba | H01L 43/12 257/421 |
| 2013/0032775 A1* | 2/2013 | Satoh | H01L 45/06 257/1 |
| 2017/0148848 A1 | 5/2017 | Ahn et al. | |
| 2018/0033953 A1 | 2/2018 | Sasaki et al. | |
| 2018/0097173 A1* | 4/2018 | Chuang | H01L 45/1675 |

(Continued)

FOREIGN PATENT DOCUMENTS

| | | |
|---|---|---|
| JP | 5445029 B2 | 3/2014 |
| JP | 2018-026525 A | 2/2018 |

(Continued)

*Primary Examiner* — Shahed Ahmed
(74) *Attorney, Agent, or Firm* — Lee IP Law, P.C.

(57) ABSTRACT

A magnetic memory device includes a first conductive line extending in a first direction on a substrate, a first magnetic pattern on the first conductive line, the first magnetic pattern including a first portion and a second portion that have different thicknesses, and a second conductive line on the first magnetic pattern and extending in a second direction intersecting the first direction.

19 Claims, 16 Drawing Sheets

(56) References Cited

U.S. PATENT DOCUMENTS

| | | |
|---|---|---|
| 2018/0123021 A1 | 5/2018 | Sasaki et al. |
| 2018/0159024 A1 | 6/2018 | Buyandalai et al. |
| 2020/0091411 A1* | 3/2020 | Sonoda .................. H01L 43/10 |

FOREIGN PATENT DOCUMENTS

| | | |
|---|---|---|
| JP | 2018-074140 A | 5/2018 |
| KR | 10-0310575 B1 | 11/2001 |
| KR | 10-1729383 B1 | 4/2017 |
| KR | 10-2017-0060284 A | 6/2017 |

* cited by examiner

MAGNETIC MEMORY DEVICES

CROSS-REFERENCE TO RELATED APPLICATION

Korean Patent Application No. 10-2018-0139731, filed on Nov. 14, 2018, in the Korean Intellectual Property Office, and entitled: "Magnetic Memory Devices," is incorporated by reference herein in its entirety.

BACKGROUND

1. Field

Embodiments relate to a semiconductor device and, more particularly, to magnetic memory devices including magnetic tunnel junctions.

2. Description of the Related Art

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. The magnetic memory devices may emerge as next-generation semiconductor memory devices because of their high-speed and/or non-volatile characteristics.

Generally, a magnetic memory device may include a magnetic tunnel junction (MTJ). The magnetic tunnel junction may include two magnetic layers and an insulating layer disposed between the two magnetic layers. A resistance value of the magnetic tunnel junction may be changed depending on magnetization directions of the two magnetic layers. For example, when the magnetization directions of the two magnetic layers are anti-parallel to each other, the magnetic tunnel junction may have a relatively high resistance value. When the magnetization directions of the two magnetic layers are parallel to each other, the magnetic tunnel junction may have a relatively low resistance value. The magnetic memory device may read/write data using a difference between the resistance values of the magnetic tunnel junction. Highly integrated and/or low-power magnetic memory devices have been increasingly demanded with the development of an electronic industry. Thus, various researches are being conducted to satisfy these demands.

SUMMARY

In an aspect, a magnetic memory device may include a first conductive line extending in a first direction on a substrate, a first magnetic pattern on the first conductive line, and a second conductive line disposed on the first magnetic pattern and extending in a second direction intersecting the first direction. The first magnetic pattern may include a first portion and a second portion, which have different thicknesses.

In an aspect, a magnetic memory device may include a first conductive line extending in a first direction on a substrate, the first conductive line having a recess portion recessed from a top surface thereof, a magnetic pattern disposed on the first conductive line and filling the recess portion, and a second conductive line disposed on the magnetic pattern and extending in a second direction intersecting the first direction.

In an aspect, a magnetic memory device may include a first conductive line extending in a first direction on a substrate, a first magnetic pattern on the first conductive line, and a second conductive line disposed on the first magnetic pattern and extending in a second direction intersecting the first direction. A center of the first magnetic pattern may be shifted in the second direction from a center of a first portion, which vertically overlaps with the second conductive line, of the first conductive line when viewed in a plan view.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
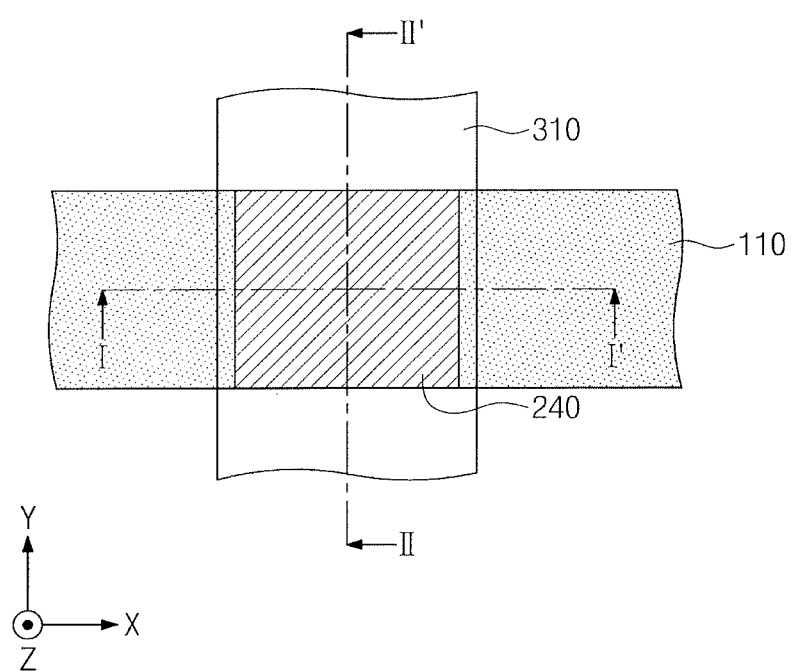
FIG. 1 illustrates a plan view of a magnetic memory device according to some embodiments.
Figure 2A:
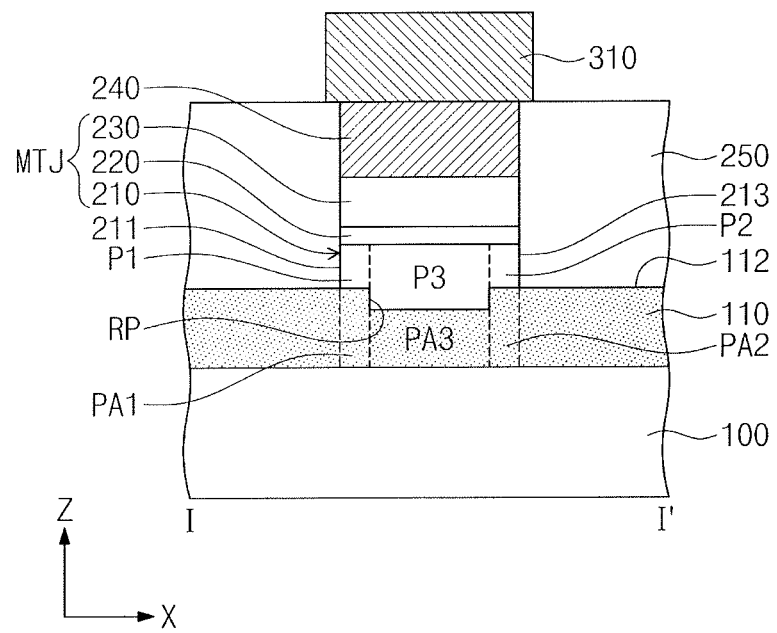
FIG. 2A illustrates a cross-sectional view along line I-I' of FIG. 1.
Figure 2B:
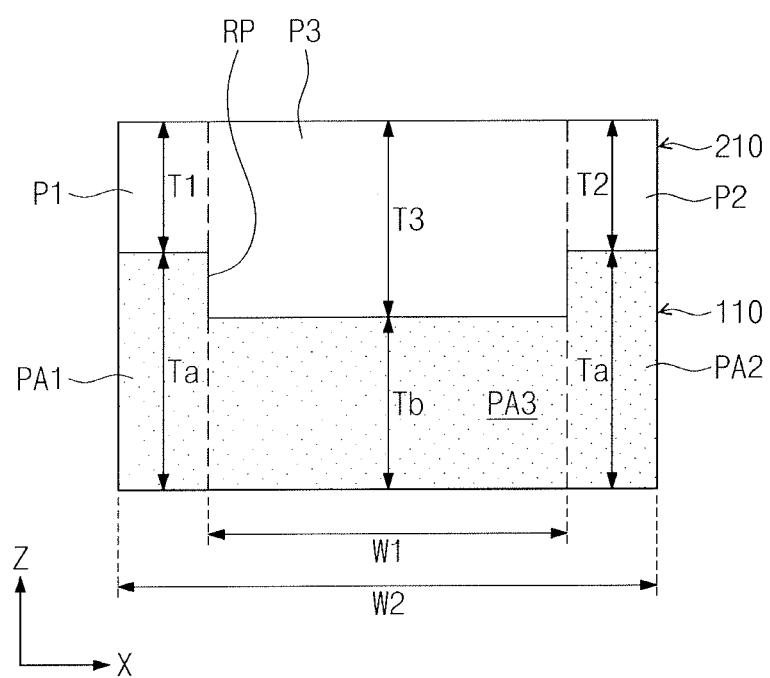
FIG. 2B illustrates an enlarged view of a first magnetic pattern and a first conductive line.
Figure 2C:
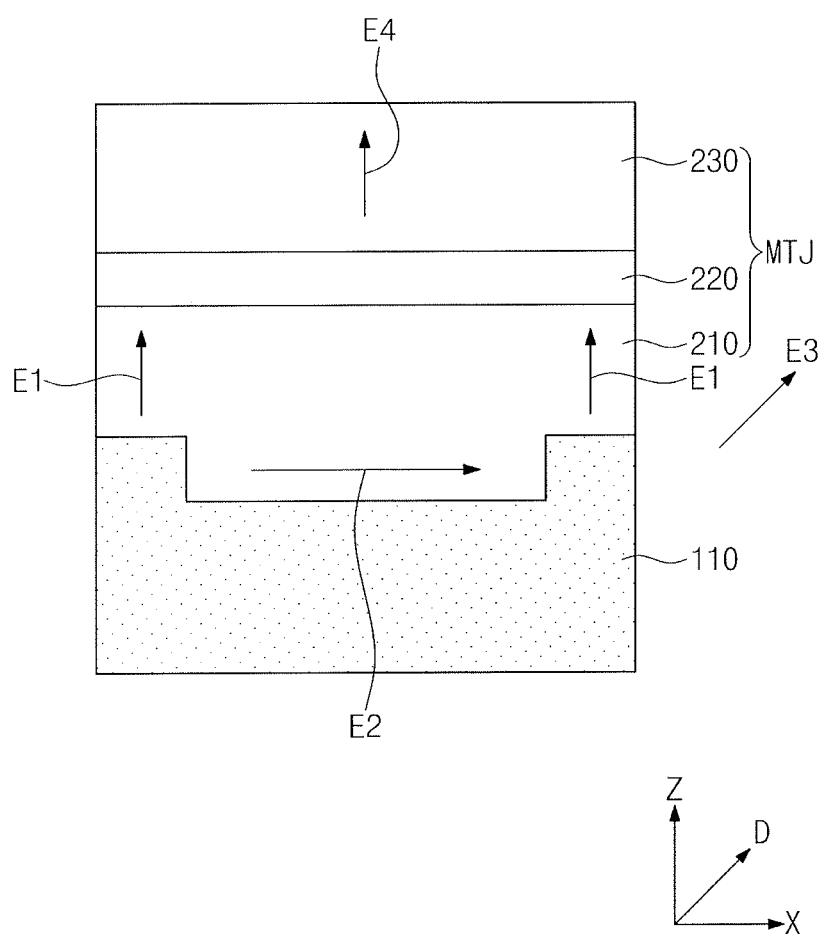
FIG. 2C illustrates an enlarged view of a first conductive line and a magnetic tunnel junction pattern.
Figure 3:
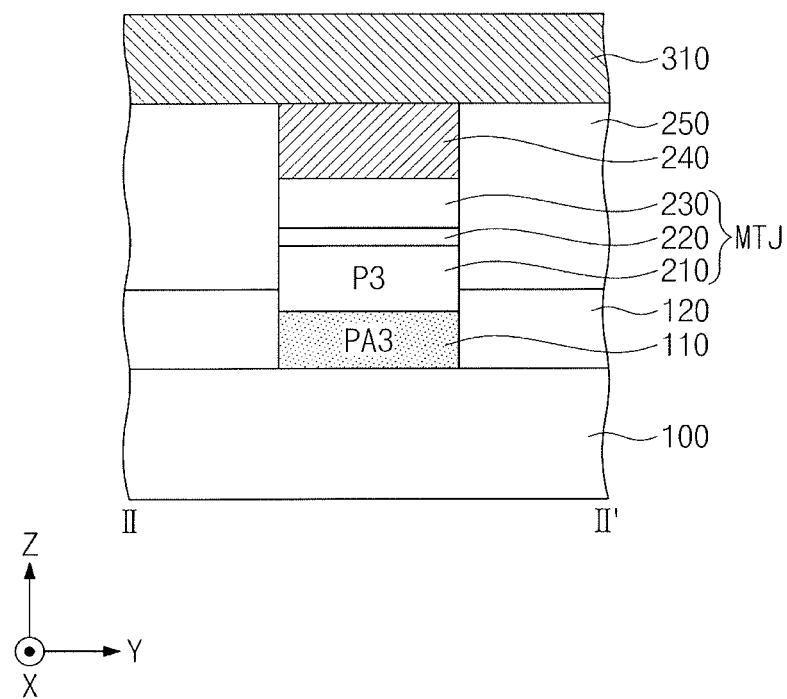
FIG. 3 illustrates a cross-sectional view along line II-II' of FIG. 1.

FIG. 1 is a plan view illustrating a magnetic memory device according to some embodiments. FIG. 2A is a cross-sectional view taken along line I-I' of FIG. 1 to illustrate a magnetic memory device according to some embodiments. FIG. 2B is an enlarged view of a first magnetic pattern and a first conductive line. FIG. 2C is an enlarged view of a first conductive line and a magnetic tunnel junction pattern. FIG. 3 is a cross-sectional view taken along line II-II' of FIG. 1 to illustrate a magnetic memory device according to some embodiments.

Referring to FIGS. 1, 2A and 3, a first conductive line 110 may be disposed on a substrate 100. The substrate 100 may include a semiconductor substrate. The semiconductor substrate may include, e.g., silicon (Si), silicon on an insulator (SOI), silicon-germanium (SiGe), germanium (Ge), or gallium-arsenic (GaAs). A selection element may be disposed in the substrate 100. The selection element may be, e.g., a field effect transistor or a diode.

The first conductive line 110 may extend in a first direction X on a top surface of the substrate 100. The first conductive line 110 may have a line shape. The first conductive line 110 may have a recess portion RP recessed from a top surface 112 of the first conductive line 110. A bottom surface of the recess portion RP may be located at a level between the top surface 112 and a bottom surface of the first conductive line 110. For example, referring to FIGS. 1, 2A, and 3, the recess portion RP may extend through an entire width of the first conductive line 110 in the first direction X. In some embodiments, electrodes may be connected to both end portions of the first conductive line 110 to allow a current to flow in the first conductive line 110.

The first conductive line 110 may include a heavy metal or a material doped with a heavy metal. For example, the first conductive line 110 may include at least one of 'A', or 'M' doped with 'B'. The 'A' may include, e.g., yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta, including high-resistance amorphous β-Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), and/or any combination thereof. The 'B' may include, e.g., at least one of vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (1), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or ytterbium (Yb). The 'M' may include, e.g., at least one of aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt), gold (Au), mercury (Hg), lead (Pb), silicon (Si), gallium (Ga), gallium-manganese (GaMn), or gallium-arsenic (GaAs). For example, the first conductive line 110 may include copper (Cu) doped with iridium (Ir), and/or copper (Cu) doped with bismuth (Bi).

A first interlayer insulating layer 120 may be disposed on the top surface of the substrate 100 at both sides of the first conductive line 110, as illustrated in FIG. 3. The first interlayer insulating layer 120 may cover sidewalls of the first conductive line 110. A top surface of the first interlayer insulating layer 120 may be located at a higher level than the bottom surface of the recess portion RP (FIG. 3) and may be located at the same level as the top surface 112 of the first conductive line 110. For example, the first interlayer insulating layer 120 may include an oxide layer or a nitride layer. The oxide layer may be, e.g., a silicon oxide layer, a magnesium oxide layer, a tantalum oxide layer, or a hafnium oxide layer. The nitride layer may be, e.g., a titanium nitride layer, a tantalum nitride layer, or a tungsten nitride layer.

A second conductive line 310 may be disposed on the first conductive line 110. The second conductive line 310 may extend in a second direction Y intersecting the first direction X on the first conductive line 110. The second conductive line 310 may include at least one of a metal (e.g., copper) or a conductive metal nitride. The second conductive line 310 may function as a bit line.

A magnetic tunnel junction pattern MTJ may be disposed between the first conductive line 110 and the second conductive line 310. The magnetic tunnel junction pattern MTJ may include a first magnetic pattern 210, a tunnel barrier pattern 220, and a second magnetic pattern 230. The first magnetic pattern 210 may be disposed between the first conductive line 110 and the second conductive line 310. The tunnel barrier pattern 220 may be disposed between the first magnetic pattern 210 and the second conductive line 310. The second magnetic pattern 230 may be disposed between the tunnel barrier pattern 220 and the second conductive line 310.

The first magnetic pattern 210 will be described hereinafter with reference to FIG. 2B. FIG. 2B illustrates an enlarged view of the bottom of the magnetic tunnel junction pattern MTJ of FIG. 2A.

Referring to FIGS. 2A and 2B, the first magnetic pattern 210 may be disposed on the top surface 112 of the first conductive line 110 and in the recess portion RP of the first conductive line 110. A width W1 of the recess portion RP in the first direction X may be less than a width W2 of the first magnetic pattern 210 in the first direction X (W 1<W2). The first magnetic pattern 210 may have a first sidewall 211 and a second sidewall 213 which are opposite to each other in the first direction X. The first magnetic pattern 210 may include a first portion P1 adjacent to the first sidewall 211, a second portion P2 adjacent to the second sidewall 213, and a third portion P3 between the first portion P1 and the second portion P2. The third portion P3 may be disposed in the recess portion RP of the first conductive line 110. The first portion P1 and the second portion P2 may be disposed on the top surface 112 of the first conductive line 110. A thickness T1 of the first portion P1 in the third direction Z may be substantially equal to a thickness T2 of the second portion P2 in the third direction Z (T1=T2). A thickness T3 of the third portion P3 in the third direction Z may be greater than the thicknesses T1 and T2 of the first and second portions P1 and P2 (T3>T1 and T3>T2). For example, as illustrated in FIG. 2A, upper surface of the first through third portions P1 through P3 may be level with each other. The first magnetic pattern 210 may have a T-shape when viewed in a cross-sectional view. The first magnetic pattern 210 may include a free layer having a changeable magnetization direction. It is noted that the first through third portions P1 through P3 are integral with each other and define a single and seamless magnetic pattern, and the division into portions is only for convenience of description.

In some embodiments, the first magnetic pattern 210 may include at least one of, e.g., a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of, e.g., FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

In certain embodiments, the first magnetic pattern 210 may include a horizontal magnetic material. The horizontal magnetic material may include, e.g., a ferromagnetic material. For example, the ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3FesO_{12}$.

Referring to FIGS. 2B and 2C, even though the first magnetic pattern 210 includes the perpendicular magnetic material or the horizontal magnetic material, magnetic anisotropy of the first magnetic pattern 210 may be changed depending on a thickness thereof, e.g., in the third direction Z. For example, when the thickness of the first magnetic pattern 210 is great, the first magnetic pattern 210 may have horizontal magnetic anisotropy. When the thickness of the first magnetic pattern 210 is small, the first magnetic pattern 210 may have perpendicular magnetic anisotropy. The first magnetic pattern 210 may have both the perpendicular magnetic anisotropy and the horizontal magnetic anisotropy. For example, magnetization directions E1 of the first and second portions P1 and P2 of the first magnetic pattern 210 may be substantially perpendicular (i.e., in the third direction Z) to the top surface of the substrate 100, and a magnetization direction E2 of the third portion P3 of the first magnetic pattern 210 may be substantially horizontal (e.g., the X-direction) to the top surface of the substrate 100.

In other words, the first and second portions P1 and P2 of the first magnetic pattern 210 may have smaller thickness and the perpendicular magnetic anisotropy, and the third portion P3 of the first magnetic pattern 210 may have a larger thickness and the horizontal magnetic anisotropy. Thus, a net magnetization direction E3 of the first magnetic pattern 210 may be inclined at an angle (θ) with respect to a direction (e.g., the X-direction) parallel to the top surface of the substrate 100 (a D-direction). The angle (θ) may be greater than 0 degree and less than 90 degrees. According to some embodiments, when the net magnetization direction E3 of the first magnetic pattern 210 is inclined at the angle (θ), the first magnetic pattern 210 may be rapidly switched by a low switching current.

In some embodiments, the first conductive line 110 may include first and second portions PA1 and PA2 vertically overlapping with the first and second portions P1 and P2 of the first magnetic pattern 210, respectively, and a third portion PA3 vertically overlapping with the third portion P3 of the first magnetic pattern 210. Thicknesses Ta of the first and second portions PA1 and PA2 of the first conductive line 110 may be greater than a thickness Tb of the third portion PA3 of the first conductive line 110 (Ta>Tb). According to some embodiments, when a certain current flows through the first conductive line 110, the current may be more concentrated in the first and second portions PA1 and PA2 of the first conductive line 110 than in the third portion PA3 of the first conductive line 110. Thus, the magnetization directions (or magnetic moments) of the first and second portions P1 and P2 of the first magnetic pattern 210 adjacent to the first and second portions PA1 and PA2 of the first conductive line 110 may be, switched faster and/or more than the magnetization direction (or magnetic moments) of the third portion P3 of the first magnetic pattern 210. As a result, when the same current flows, the first magnetic pattern 210 may be switched faster by the first conductive line 110 having different thicknesses than by a conductive line having a uniform thickness.

The tunnel barrier pattern 220 may be disposed between the first magnetic pattern 210 and the second magnetic pattern 230. For example, the tunnel barrier pattern 220 may include at least one of magnesium oxide, titanium oxide, aluminum oxide, magnesium-zinc oxide, or magnesium-boron oxide.

The second magnetic pattern 230 may include a reference layer having a magnetization direction E4 fixed in one direction. For example, the magnetization direction E4 may be substantially perpendicular (i.e., in the third direction Z) to the top surface of the substrate 100. In some embodiments, the second magnetic pattern 230 may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

In certain embodiments, the second magnetic pattern 230 may include a horizontal magnetic material. The horizontal magnetic material may include, e.g., a ferromagnetic material.

Referring back to FIG. 2A, a metal pattern 240 may be disposed between the magnetic tunnel junction pattern MTJ and the second conductive line 310. For example, the metal pattern 240 may include at least one of a metal (e.g., Ta, W, Ru, or Ir) or a conductive metal nitride (e.g., TiN). For example, as illustrated in FIGS. 2A and 3, metal pattern 240 may have a same width as the magnetic tunnel junction pattern MTJ in each of the first and second directions X and Y, and may completely overlap the top of the magnetic tunnel junction pattern MTJ.

A second interlayer insulating layer 250 may be disposed on the top surface 112 of the first conductive line 110 and the top surface of the first interlayer insulating layer 120. The second interlayer insulating layer 250 may cover sidewalls of the magnetic tunnel junction pattern MTJ and the metal pattern 240. For example, the second interlayer insulating layer 250 may include an oxide layer or a nitride layer. The oxide layer may be, e.g., a silicon oxide layer, a magnesium oxide layer, a tantalum oxide layer, or a hafnium oxide layer. The first conductive line 110, the magnetic tunnel junction pattern MTJ, and the second conductive line 310 may constitute a magnetic memory element.

Figure 4:
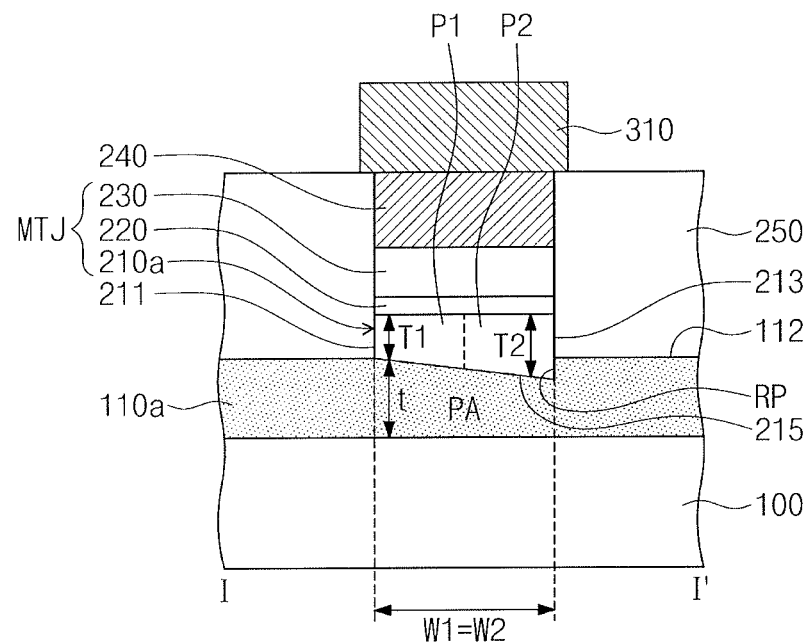
FIG. 4 illustrates a cross-sectional view along line I-I' of FIG. 1 to illustrate a magnetic memory device according to other embodiments.

FIG. 4 is a cross-sectional view taken along the line I-I' of FIG. 1 to illustrate a magnetic memory device according to some embodiments.

Referring to FIG. 4, a first magnetic pattern 210a may be disposed in a recess portion RP of a first conductive line 110a. A width W1 of the recess portion RP of the first conductive line 110a may be substantially equal to a width W2 of the first magnetic pattern 210a. In other words, the first magnetic pattern 210a may not be disposed on the top surface 112 of the first conductive line 110a. A thickness of the first magnetic pattern 210a may become progressively greater from the first sidewall 211 to the second sidewall 213 of the first magnetic pattern 210a. A bottom surface 215 of the first magnetic pattern 210a may be inclined. A thickness t of a portion PA of the first conductive line 110a overlapping with the first magnetic pattern 210a may become progressively less in the direction in which the thickness of the first magnetic pattern 210a becomes progressively greater.

The first magnetic pattern 210a may include a first portion P1 adjacent to the first sidewall 211 of the first magnetic pattern 210a and a second portion P2 adjacent to the second sidewall 213 of the first magnetic pattern 210a. In some embodiments, a maximum thickness T1 of the first portion P1 may be less than a maximum thickness T2 of the second portion P2 (T1<T2). In some embodiments, the first magnetic pattern 210a may have a trapezoidal shape when viewed in a cross-sectional view.

Figure 5:
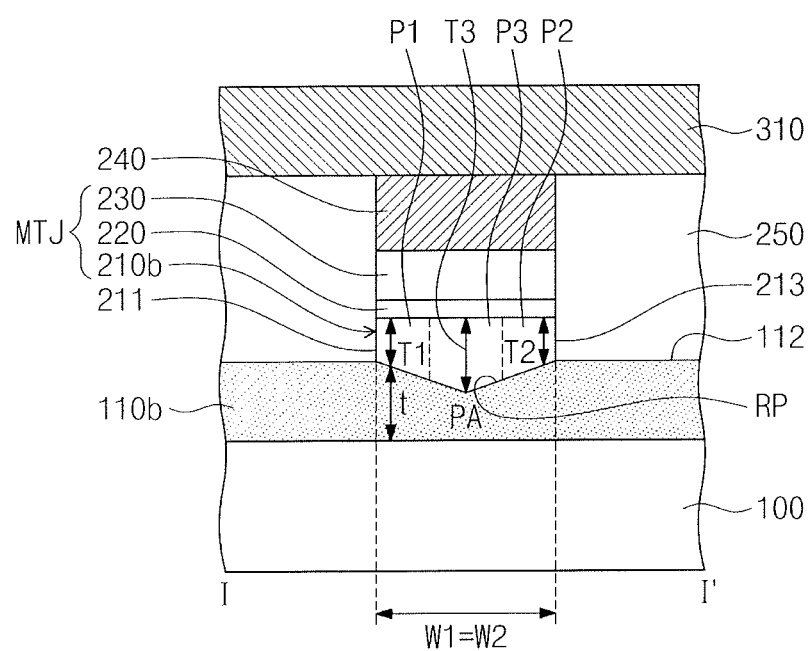
FIG. 5 illustrates a cross-sectional view along line I-I' of FIG. 1 to illustrate a magnetic memory device according to other embodiments.

FIG. 5 is a cross-sectional view taken along the line I-I' of FIG. 1 to illustrate a magnetic memory device according to some embodiments.

Referring to FIG. 5, a first magnetic pattern 210b may be disposed in a recess portion RP of a first conductive line 110b. A width W1 of the recess portion RP of the first conductive line 110b may be substantially equal to a width W2 of the first magnetic pattern 210b (W 1=W2). In other words, the first magnetic pattern 210b may not be disposed on the top surface 112 of the first conductive line 110b. A thickness of the first magnetic pattern 210b may become progressively greater and then progressively less from the first sidewall 211 to the second sidewall 213 of the first magnetic pattern 210b. In some embodiments, the first magnetic pattern 210b may include a first portion P1 adjacent to the first sidewall 211 of the first magnetic pattern 210b, a second portion P2 adjacent to the second sidewall 213 of the first magnetic pattern 210b, and a third portion P3 between the first portion P1 and the second portion P2. A maximum thickness T1 of the first portion P1 of the first magnetic pattern 210b may be substantially equal to a maximum thickness T2 of the second portion P2 of the first magnetic pattern 210b (T1=T2). A maximum thickness T3 of the third portion P3 of the first magnetic pattern 210b may be greater than the maximum thicknesses T1 and T2 of the first and second portions P1 and P2 of the first magnetic pattern 210b (T3>T1 and T3>T2). The first magnetic pattern 210b may have the maximum thickness in the third portion P3 and may have the minimum thicknesses in the first and second portions P1 and P2. A lower portion of the first magnetic pattern 210b may be tapered.

A thickness t of a portion PA of the first conductive line 110b overlapping with the first magnetic pattern 210b may become progressively less and then progressively greater in the direction in which the thickness of the first magnetic pattern 210b becomes progressively greater and then progressively less. The first conductive line 110b may have the minimum thickness in a portion of the first conductive line 110b, which vertically overlaps with the third portion P3 of the first magnetic pattern 210b. The first conductive line 110b may have the maximum thicknesses in portions of the first conductive line 110b, which vertically overlap with the first and second portions P1 and P2 of the first magnetic pattern 210b. In some embodiments, the recess portion RP of the first conductive line 110b may be tapered.

Figure 6:
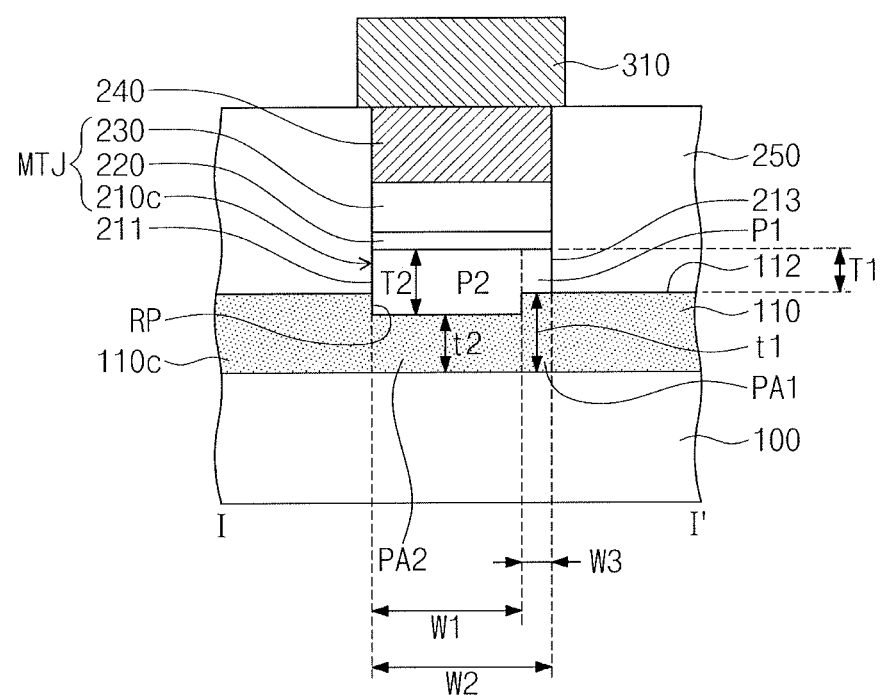
FIG. 6 illustrates a cross-sectional view along line I-I' of FIG. 1 to illustrate a magnetic memory device according to other embodiments.

FIG. 6 is a cross-sectional view taken along the line I-I' of FIG. 1 to illustrate a magnetic memory device according to some embodiments.

Referring to FIG. 6, a first magnetic pattern 210c may include a first portion P1 disposed on the top surface 112 of the first conductive line 110c and a second portion P2 disposed in the recess portion RP of the first conductive line 110c. A width W1 of the recess portion RP may be less than a width W2 of the first magnetic pattern 210c (W1<W2). A width of the second portion P2 of the first magnetic pattern 210c may correspond to the width W1 of the recess portion RP, and the width W1 of the second portion P2 of the first magnetic pattern 210c may be greater than a width W3 of the first portion P1 of the first magnetic pattern 210c (W1>W3). A thickness T1 of the first portion P1 may be less than a thickness T2 of the second portion P2 (T1<T2). In some embodiments, the first magnetic pattern 210c may have a reverse L-shape when viewed in a cross-sectional view.

The first conductive line 110c may include a first portion PA vertically overlapping with the first portion P1 of the first magnetic pattern 210c and a second portion PA2 vertically overlapping with the second portion P2 of the first magnetic pattern 210c. A thickness t1 of the first portion PA1 of the first conductive line 110c may be greater than a thickness t2 of the second portion PA2 of the first conductive line 110c.

Figure 7:
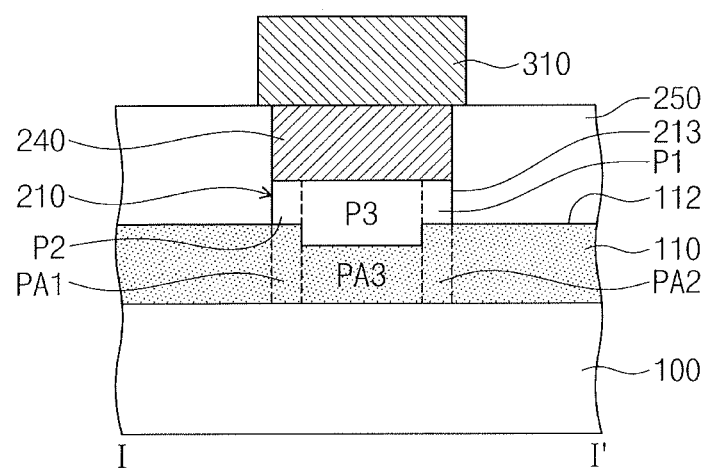
FIG. 7 illustrates a cross-sectional view along line I-I' of FIG. 1 to illustrate a magnetic memory device according to other embodiments.

FIG. 7 is a cross-sectional view taken along the line I-I' of FIG. 1 to illustrate a magnetic memory device according to some embodiments.

Referring to FIG. 7, the tunnel barrier pattern 220 and the second magnetic pattern 230 of FIG. 2 may be omitted. In this case, the metal pattern 240 may be in direct contact with a top surface of the first magnetic pattern 210.

Figure 8:
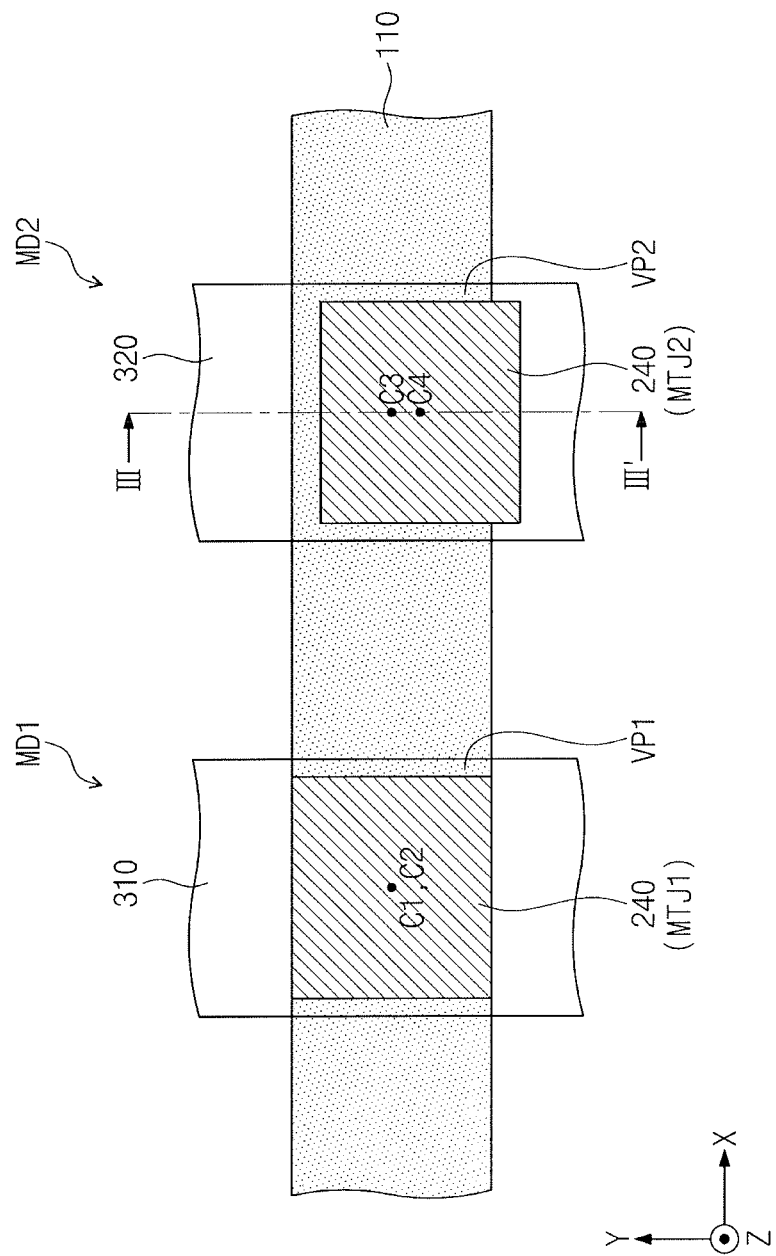
FIG. 8 illustrates a plan view of a magnetic memory device according to some embodiments.
Figure 9:
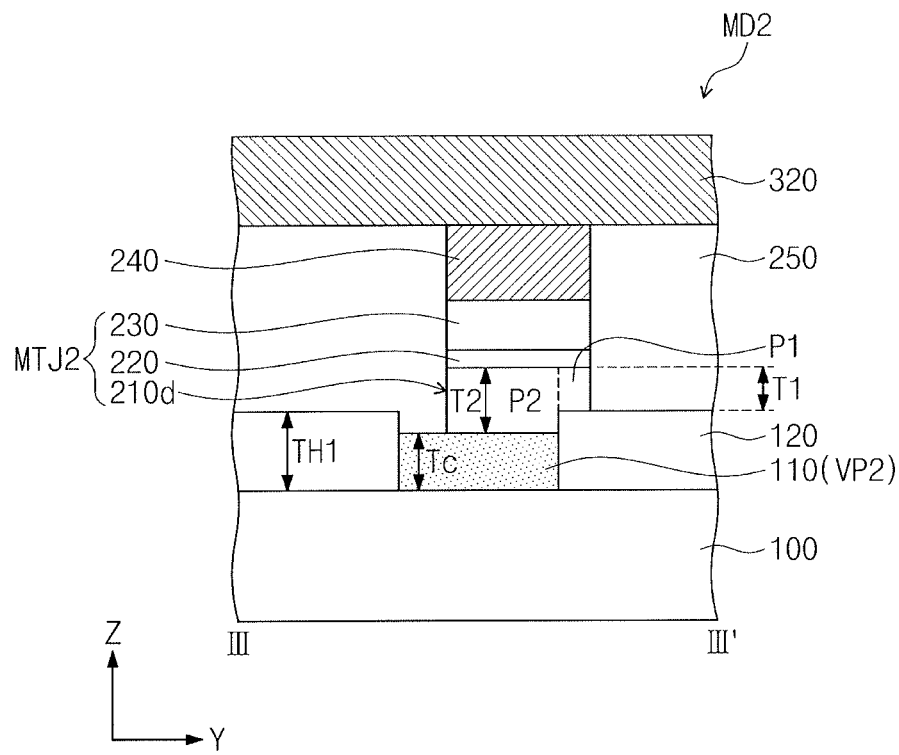
FIG. 9 illustrates a cross-sectional view along line III-III' of FIG. 8.

FIG. 8 is a plan view illustrating a magnetic memory device according to some embodiments. FIG. 9 is a cross-sectional view taken along line III-III' of FIG. 8 to illustrate a magnetic memory device according to some embodiments.

Referring to FIGS. 8 and 9, a magnetic memory device may include a first magnetic memory element MD1 and a second magnetic memory element MD2. The first magnetic memory element MD1 may have one of the structures described with reference to FIGS. 1 to 7. For example, the first magnetic memory element MD1 may include the first conductive line 110, a first magnetic tunnel junction pattern MTJ1, and the second conductive line 310, and the second magnetic memory element MD2 may include the first conductive line 110, a second magnetic tunnel junction pattern MTJ2, and a third conductive line 320. The first magnetic tunnel junction pattern MTJ1 and the second magnetic tunnel junction pattern MTJ2 may be disposed on the first conductive line 110. The first magnetic tunnel junction pattern MTJ1 and the second magnetic tunnel junction pattern MTJ2 may be connected in common to the first conductive line 110. The second conductive line 310 may be disposed on the first magnetic tunnel junction pattern MTJ1, and the third conductive line 320 may be disposed on the second magnetic tunnel junction pattern MTJ2. The second conductive line 310 may extend in the second direction Y on the first magnetic tunnel junction pattern MTJ1, and the third conductive line 320 may extend in the second direction Y on the second magnetic tunnel junction pattern MTJ2.

In some embodiments, the first conductive line 110 may include a first vertical portion VP1 vertically overlapping with the second conductive line 310 and a second vertical portion VP2 vertically overlapping with the third conductive line 320. A center C1 of the first vertical portion VP1 of the first conductive line 110 may overlap with a center C2 of the first magnetic tunnel junction pattern MTJ when viewed in a plan view. A center C3 of the second vertical portion VP2 of the first conductive line 110 may not overlap with a center C4 of the second magnetic tunnel junction pattern MTJ2 when viewed in a plan view. For example, the center C4 of the second magnetic tunnel junction pattern MTJ2 may be shifted from the center C3 of the second vertical portion VP2 in the second direction Y.

Hereinafter, the second magnetic memory element MD2 will be mainly described in detail with reference to FIG. 9.

Referring to FIG. 9, a thickness TH1 of the first interlayer insulating layer 120 in the third direction Z may be greater than a thickness Tc of the second vertical portion VP2 of the first conductive line 110 in the third direction Z vertically overlapping with the second magnetic tunnel junction pattern MTJ2 (or the third conductive line 320). The top surface of the first interlayer insulating layer 120 may be located at a higher level than a top surface of the second vertical portion VP2 of the first conductive line 110. In some embodiments, the thickness Tc of the second vertical portion VP2 of the first conductive line 110 may be substantially uniform along the second direction Y. The second magnetic tunnel junction pattern MTJ2 may be disposed between the first conductive line 110 and the third conductive line 320. The second magnetic tunnel junction pattern MTJ2 may include a first magnetic pattern 210d, the tunnel barrier pattern 220, and the second magnetic pattern 230, which are sequentially stacked on the first conductive line 110.

The first magnetic pattern 210d may be disposed on the second vertical portion VP2 of the first conductive line 110. The first magnetic pattern 210d may include a first portion P1 vertically overlapping with the first interlayer insulating layer 120 and a second portion P2 vertically overlapping with the second vertical portion VP2 of the first conductive line 110. A bottom surface of the first portion P1 of the first magnetic pattern 210d may be in contact with the first interlayer insulating layer 120, and a bottom surface of the second portion P2 of the first magnetic pattern 210d may be in contact with the first conductive line 110. The first magnetic pattern 210d may expose a portion of a top surface of the second vertical portion VP2 of the first conductive line 110. A thickness T1 of the first portion P1 of the first magnetic pattern 210d may be less than a thickness T2 of the second portion P2 of the first magnetic pattern 210d (T1<T2). The first magnetic pattern 210d may have a reverse L-shape when viewed in a cross-sectional view.

According to some embodiments, perpendicular magnetic anisotropy in the first portion P1 of the first magnetic pattern 210d which is in contact with the first interlayer insulating layer 120 may be greater than perpendicular magnetic anisotropy in the second portion P2 of the first magnetic pattern 210d which is in contact with the first conductive line 110. Thus, total perpendicular magnetic anisotropy of the first magnetic pattern 210d of the second magnetic tunnel junction pattern MTJ2 may be greater than that of a first magnetic pattern of a magnetic tunnel junction pattern in which the first magnetic pattern is in contact with only the first conductive line 110. For example, the perpendicular magnetic anisotropy of the first magnetic pattern 210d of the second magnetic tunnel junction pattern MTJ2 may be greater than perpendicular magnetic anisotropy of the first magnetic pattern 210 (see FIG. 3) of the first magnetic tunnel junction pattern MTJ. As a result, since the first and second magnetic tunnel junction patterns MTJ1 and MTJ2 having different resistance values are provided, a magnetic memory device including a unit cell capable of writing data of 2 bits or more may be provided.

The second interlayer insulating layer 250 may be disposed between the first interlayer insulating layer 120 and the third conductive line 320. The second interlayer insulating layer 250 may cover sidewalls of the second magnetic tunnel junction pattern MTJ2, sidewalls of the metal pattern 240 between the second magnetic tunnel junction pattern MTJ2 and the third conductive line 320, the top surface of the first interlayer insulating layer 120, and the portion of the top surface of the second vertical portion VP2 of the first conductive line 110 which is exposed by the first magnetic pattern 210.

Figure 10:
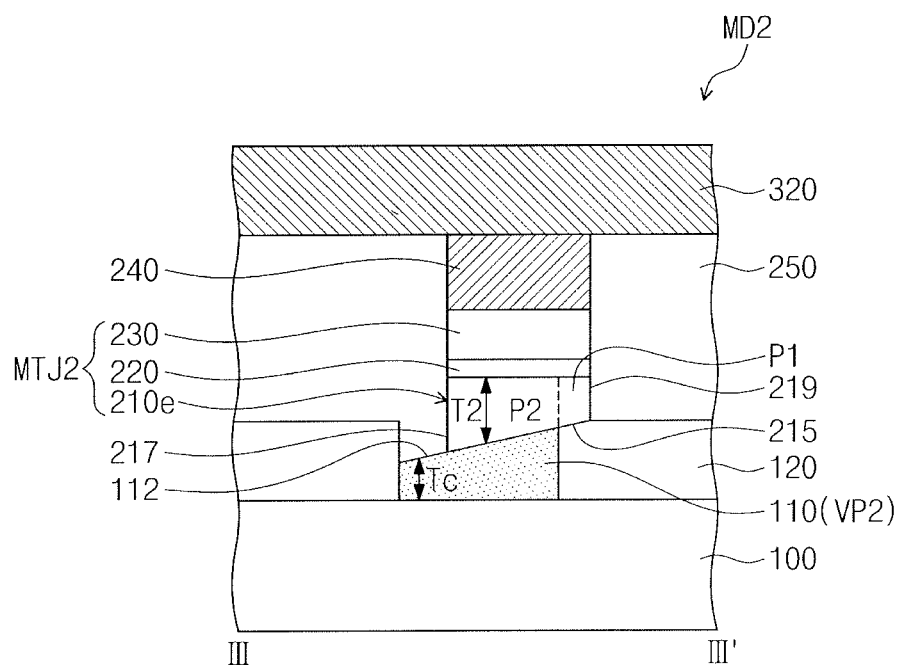
FIG. 10 illustrates a cross-sectional view along line III-III' of FIG. 8 to illustrate a magnetic memory device according to other embodiments.

FIG. 10 is a cross-sectional view taken along line III-III' of FIG. 8 to illustrate a magnetic memory device according to some embodiments.

Referring to FIG. 10, a first magnetic pattern 210e may have a third sidewall 217 and a fourth sidewall 219 which are opposite to each other in the second direction Y. The first magnetic pattern 210e may have a thickness T2 which becomes progressively less from the third sidewall 217 to the fourth sidewall 219. The first magnetic pattern 210e may include a first portion P1 and a second portion P2. The first portion P1 may vertically overlap with the first interlayer insulating layer 120, and the second portion P2 may vertically overlap with the second vertical portion VP2 of the first conductive line 110. The first magnetic pattern 210e may expose a portion of a top surface of the second vertical portion VP2 of the first conductive line 110. A maximum thickness of the first portion P1 of the first magnetic pattern 210e may be less than a maximum thickness of the second portion P2 of the first magnetic pattern 210e. A bottom surface 215 of the first magnetic pattern 210e may be inclined.

A thickness Tc of the first conductive line 110 may become progressively greater in the direction in which the thickness T2 of the first magnetic pattern 210e becomes progressively less. A top surface 112 of the first conductive line 110 may be inclined.

Figure 11:
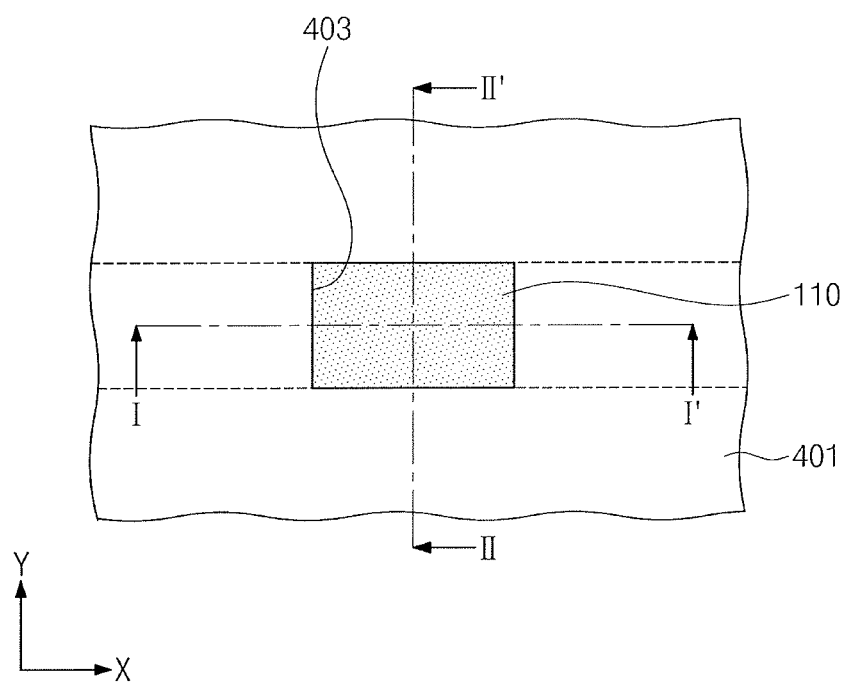
FIGS. 11, 16 and 19 illustrate plan views of stages in a method of manufacturing a magnetic memory device, according to some embodiments.
Figure 15:
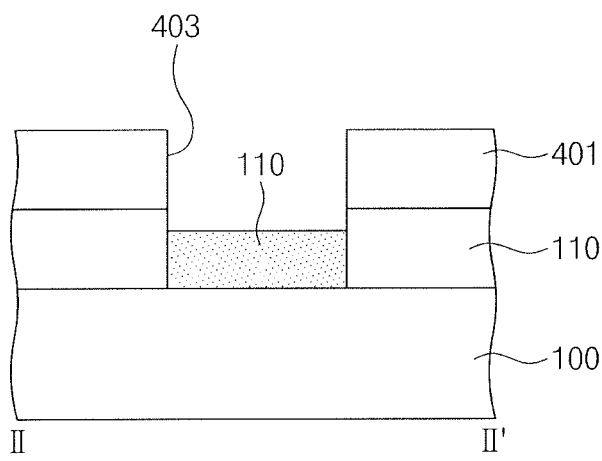
Figure 16:
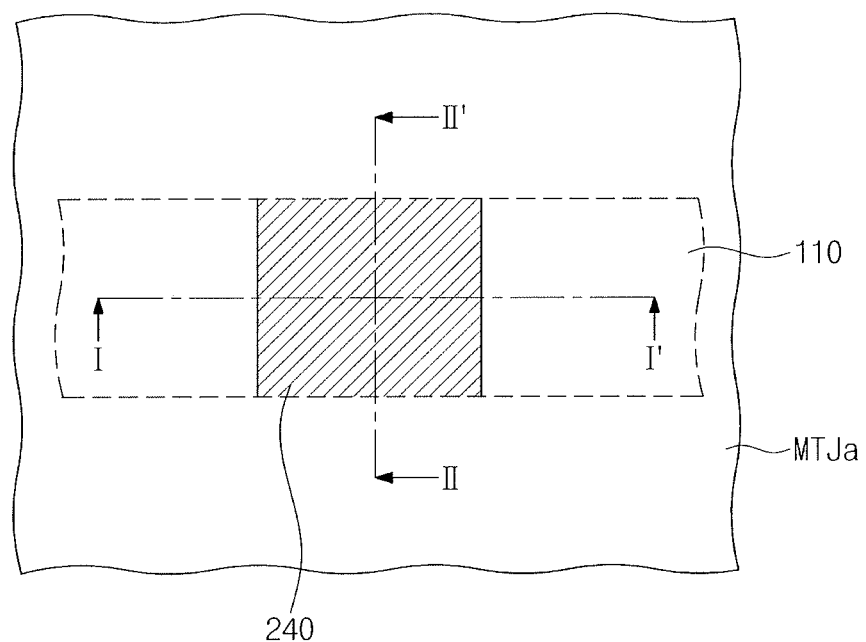
Figure 18:
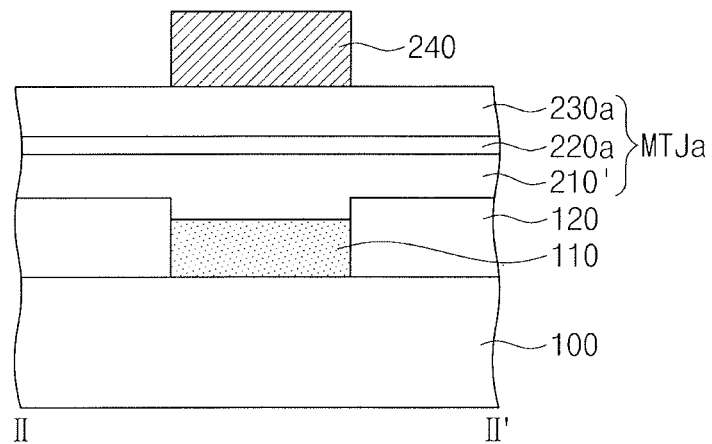
Figure 19:
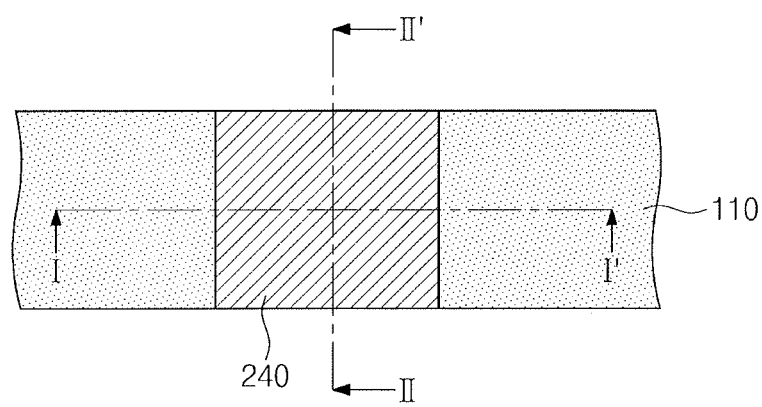

FIGS. 11, 16 and 19 are plan views illustrating stages in a method of manufacturing a magnetic memory device, according to some embodiments. FIGS. 12, 14, 17 and 20 are cross-sectional views taken along lines I-I' of FIGS. 11, 16 and 19. FIGS. 13, 15, 18 and 21 are cross-sectional views taken along lines II-II' of FIGS. 11, 16 and 19.

Figure 12:
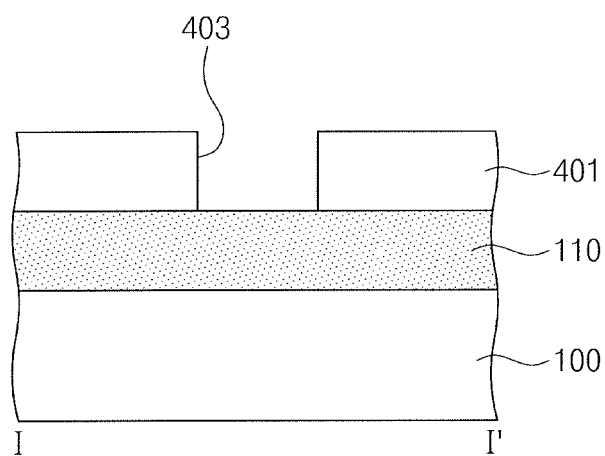
FIGS. 12, 14, 17 and 20 illustrate cross-sectional views along lines I-I' of FIGS. 11, 16 and 19.
Figure 13:
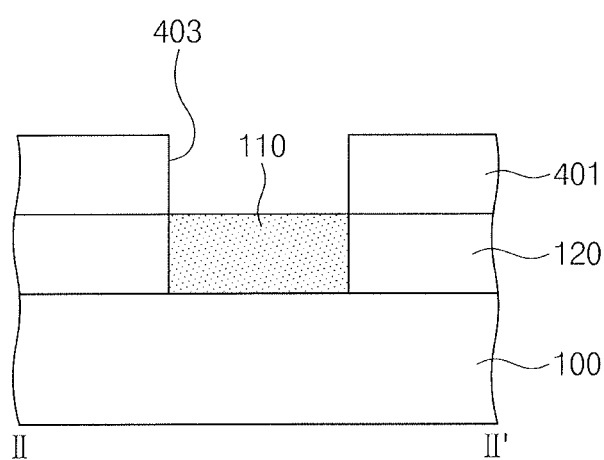
FIGS. 13, 15, 18 and 21 illustrate cross-sectional views along lines II-I' of FIGS. 11, 16 and 19.

Referring to FIGS. 1, 12 and 13, the first conductive line 110 may be formed on the substrate 100. A conductive layer may be formed on the substrate 100, and a patterning process may be performed on the conductive layer to form the first conductive line 110. The first conductive line 110 may extend in the first direction X. The first interlayer insulating layer 120 may be formed on the substrate 100. The first interlayer insulating layer 120 may cover sidewalls of the first conductive line 110. The first interlayer insulating layer 120 may be formed to have a top surface which is located at substantially the same level as the top surface 112 of the first conductive line 110.

A photoresist pattern 401 may be formed on the first conductive line 110 and the first interlayer insulating layer 120. The photoresist pattern 401 may cover the top surface of the first interlayer insulating layer 120 and may have an opening 403 exposing a portion of the first conductive line 110.

Figure 14:
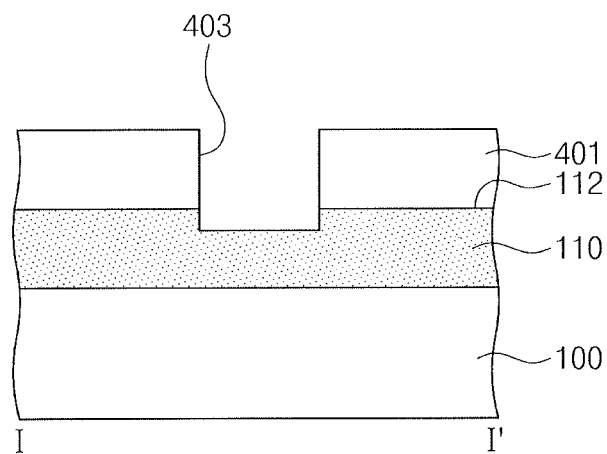

Referring to FIGS. 14 and 15, a portion of the first conductive line 110 may be etched using the photoresist pattern 401 as an etch mask. Thus, the recess portion RP may be formed in the first conductive line 110. A bottom surface of the recess portion RP may be located at a lower level than the top surface 112 of the first conductive line 110 covered by the photoresist pattern 401. The etching process may be performed by a dry etching process or a wet etching process. After the etching process, a remaining photoresist pattern 401 may be removed. The removal process may be performed by an ashing process and/or a strip process.

Figure 17:
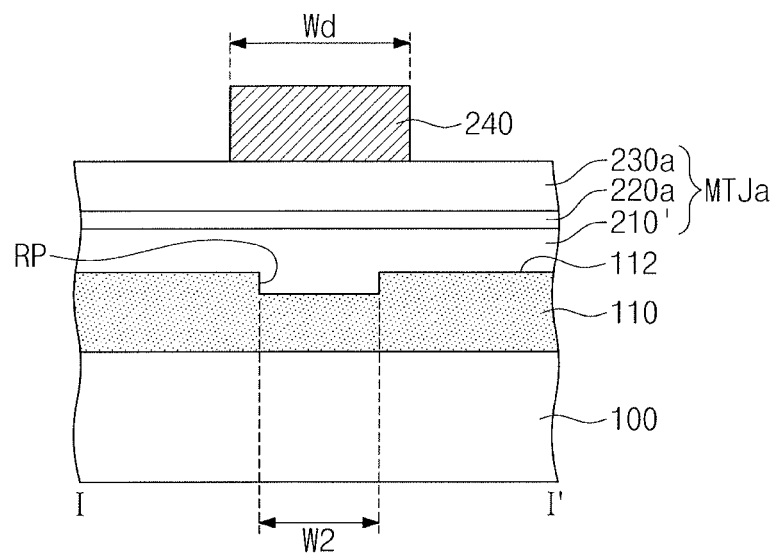

Referring to FIGS. 16, 17 and 18, a magnetic tunnel junction layer MTJa may be formed on the first conductive line 110 and the first interlayer insulating layer 120. The magnetic tunnel junction layer MTJa may include a first magnetic layer 210', a tunnel barrier layer 220a, and a second magnetic layer 230a, which are sequentially formed on the first conductive line 110 and the first interlayer insulating layer 120. The first magnetic layer 210' may cover the top surfaces of the first conductive line 110 and the first interlayer insulating layer 120 and may fill the recess portion RP. The first magnetic layer 210' may be formed of the same material as the first magnetic pattern 210 described with reference to FIGS. 1 and 2A. The tunnel barrier layer 220a may be formed on the first magnetic layer 210'. The tunnel barrier layer 220a may cover a top surface of the first magnetic layer 210'. The tunnel barrier layer 220a may be formed of the same material as the tunnel barrier pattern 220 described with reference to FIGS. 1 and 2A. The second magnetic layer 230a may be formed on the tunnel barrier layer 220a. The second magnetic layer 230a may cover a top surface of the tunnel barrier layer 220a. The second magnetic layer 230a may be formed of the same material as the second magnetic pattern 230 described with reference to FIGS. 1 and 2A.

A metal pattern 240 may be formed on the magnetic tunnel junction layer MTJa. The metal pattern 240 may vertically overlap with the recess portion RP of the first conductive line 110. A width Wd of the metal pattern 240 in the first direction X may be greater than a width W2 of the recess portion RP in the first direction X (Wd>W2).

Figure 20:
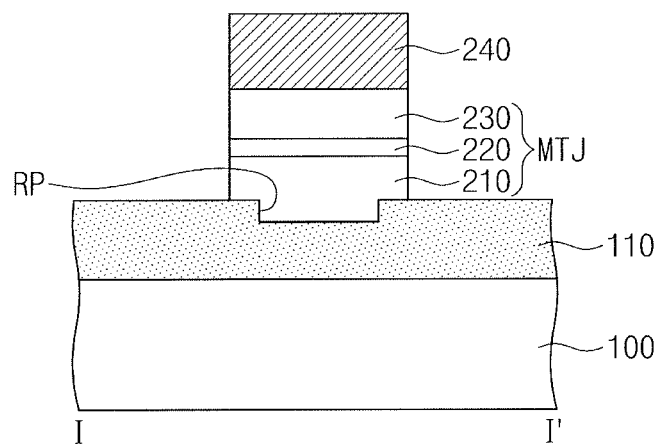
Figure 21:
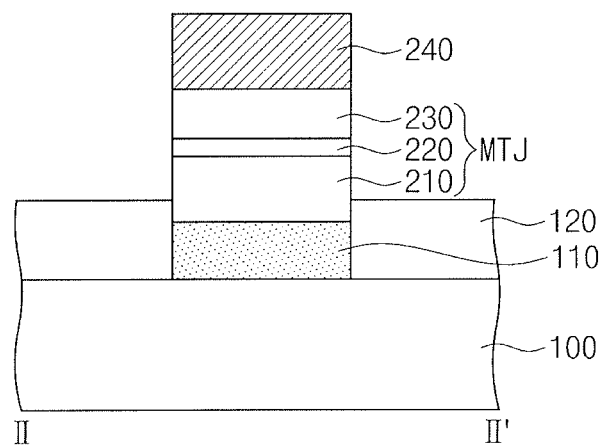

Referring to FIGS. 19, 20 and 21, the magnetic tunnel junction layer MTJa may be patterned using the metal pattern 240 as an etch mask. For example, the second magnetic layer 230a, the tunnel barrier layer 220a, and the first magnetic layer 210' may be sequentially patterned using the metal pattern 240 as the etch mask. Thus, a magnetic tunnel junction pattern MTJ may be formed between the first conductive line 110 and the metal pattern 240. The magnetic tunnel junction pattern MTJ may include the first magnetic pattern 210, the tunnel barrier pattern 220, and the second magnetic pattern 230, which are sequentially stacked on the first conductive line 110. The first magnetic pattern 210 may cover a portion of the top surface of the first conductive line 110 and may fill the recess portion RP. The patterning process may be performed using a wet etching process or a dry etching process.

Referring again to FIGS. 1, 2A and 3, the second interlayer insulating layer 250 may be formed on the first conductive line 110 and the first interlayer insulating layer 120. An insulating layer may be formed to cover the top surface of the first conductive line 110 exposed by the magnetic tunnel junction pattern MTJ, the top surface of the first interlayer insulating layer 120, and a top surface of the metal pattern 240. A planarization process may be performed on the insulating layer until the top surface of the metal pattern 240 is exposed, thereby forming the second interlayer insulating layer 250.

The second conductive line 310 may be formed on the metal pattern 240. The second conductive line 310 may extend in the second direction Y intersecting the first direction X.

By way of summation and review, embodiments relate to structures of a spin-orbit torque (SOT) metal line and a magnetic material, which are capable of improving SOT switching efficiency. A current may flow through the SOT metal line to apply SOT to a magnetic pattern, and thus a magnetization direction of the magnetic pattern may be switched. According to embodiments, the magnetic pattern may include portions having different thicknesses, and thus the magnetic pattern may have both perpendicular magnetic anisotropy and horizontal magnetic anisotropy. As a result, the switching efficiency of the magnetic memory device may be improved.

In addition, the first conductive line, i.e., the SOT metal line, in contact with the magnetic pattern may include portions having different thicknesses, i.e., portions corresponding to the different thicknesses of the magnetic pattern, and thus a current may be concentrated in a portion of the SOT metal line. As a result, the switching efficiency of the magnetic memory device may be improved.

Further, a magnetic pattern in contact with only a conductive line and a magnetic pattern in contact with both a conductive line and an insulating layer may be disposed on a same conductive line. Thus, the magnetic memory device may include a unit cell capable of writing data of 2 bits or more.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
a first conductive line extending in a first direction on a substrate, the first conductive line having a recess portion recessed from a top surface thereof;
a first magnetic pattern on the first conductive line and at least partially in the recess portion, the first magnetic pattern including a first portion and a second portion that have different thicknesses; and
a second conductive line on the first magnetic pattern and extending in a second direction intersecting the first direction.

2. The magnetic memory device as claimed in claim 1, wherein a bottom surface of the first magnetic pattern is inclined at an oblique angle.

3. The magnetic memory device as claimed in claim 1, wherein the first portion of the first magnetic pattern is in the recess portion, and the second portion of the first magnetic pattern is on the top surface of the first conductive line.

4. The magnetic memory device as claimed in claim 1, wherein:
the first magnetic pattern further includes a third portion,
the first magnetic pattern has a first sidewall and a second sidewall, which are opposite to each other in the first direction,
the first portion of the first magnetic pattern is adjacent to the first sidewall,
the third portion of the first magnetic pattern is adjacent to the second sidewall,
the second portion of the first magnetic pattern is between the first portion and the third portion of the first magnetic pattern,
a thickness of the first portion of the first magnetic pattern is substantially equal to a thickness of the third portion of the first magnetic pattern, and a thickness of the second portion of the first magnetic pattern is greater than the thicknesses of the first and third portions of the first magnetic pattern.

5. The magnetic memory device as claimed in claim 4, wherein a lower portion of the first magnetic pattern is tapered.

6. The magnetic memory device as claimed in claim 1, wherein the second portion of the first magnetic pattern is in the recess portion, and a width of the recess portion is less than a width of the first magnetic pattern.

7. The magnetic memory device as claimed in claim 1, wherein the first magnetic pattern has a first sidewall and a second sidewall, which are opposite to each other in the second direction, the first portion of the first magnetic pattern being adjacent to the first sidewall, and the second portion of the first magnetic pattern being adjacent to the second sidewall.

8. The magnetic memory device as claimed in claim 7, wherein the first magnetic pattern exposes a portion of a top surface of the first conductive line.

9. The magnetic memory device as claimed in claim 7, further comprising an interlayer insulating layer on the substrate at a side of the first conductive line, the first portion of the first magnetic pattern vertically overlapping with the first conductive line, and the second portion of the first magnetic pattern vertically overlapping with the interlayer insulating layer.

10. The magnetic memory device as claimed in claim 9, wherein a width of the first portion of the first magnetic pattern in the second direction is greater than a width of the second portion of the first magnetic pattern in the second direction.

11. The magnetic memory device as claimed in claim 9, wherein a top surface of the first conductive line is inclined.

12. The magnetic memory device as claimed in claim 1, wherein the first magnetic pattern has a T-shape, a reverse L-shape, or a trapezoidal shape when viewed in a cross-sectional view.

13. The magnetic memory device as claimed in claim 1, further comprising:

a tunnel barrier pattern between the first magnetic pattern and the second conductive line;
a second magnetic pattern between the tunnel barrier pattern and the second conductive line; and
a metal pattern between the second magnetic pattern and the second conductive line.

14. A magnetic memory device, comprising:
a first conductive line extending in a first direction on a substrate, the first conductive line having a recess portion recessed from a top surface thereof;
a magnetic pattern on the first conductive line and filling the recess portion; and
a second conductive line on the magnetic pattern and extending in a second direction intersecting the first direction.

15. The magnetic memory device as claimed in claim 14, wherein a width of the recess portion in the first direction is less than a width of the magnetic pattern in the first direction.

16. The magnetic memory device as claimed in claim 15, wherein the magnetic pattern includes:
a first portion in the recess portion; and
a second portion on a top surface of the first conductive line, a thickness of the first portion being greater than a thickness of the second portion.

17. The magnetic memory device as claimed in claim 14, wherein a width of the recess portion in the first direction is substantially equal to a width of the magnetic pattern in the first direction.

18. The magnetic memory device as claimed in claim 17, wherein the magnetic pattern has a first sidewall and a second sidewall, which are opposite to each other in the first direction, a thickness of the magnetic pattern progressively increasing from the first sidewall to the second sidewall.

19. The magnetic memory device as claimed in claim 14, wherein a center of the magnetic pattern is shifted in the second direction from a center of a first portion, which vertically overlaps with the second conductive line, of the first conductive line, when viewed in a plan view.

* * * * *